United States Patent
Morizumi et al.

(10) Patent No.: US 8,102,891 B2
(45) Date of Patent: Jan. 24, 2012

(54) NITRIDE SEMICONDUCTOR LASER ELEMENT

(75) Inventors: Tomonori Morizumi, Anan (JP); Atsuo Michiue, Komatsushima (JP); Hiroaki Takahashi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/716,962

(22) Filed: Mar. 3, 2010

(65) Prior Publication Data

US 2010/0158066 A1 Jun. 24, 2010

Related U.S. Application Data

(62) Division of application No. 12/166,746, filed on Jul. 2, 2008, now Pat. No. 7,701,995.

(30) Foreign Application Priority Data

Jul. 6, 2007 (JP) ................................. 2007-178915
Aug. 29, 2007 (JP) ................................. 2007-222613
Jun. 20, 2008 (JP) ................................. 2008-161731

(51) Int. Cl.
*H01S 5/00* (2006.01)
(52) U.S. Cl. ................................ 372/49.01; 372/44.011
(58) Field of Classification Search ............... 372/44.01, 372/49.01
See application file for complete search history.

(56) References Cited

U.S. PATENT DOCUMENTS

| 6,067,310 | A | 5/2000 | Hashimoto et al. |
| 6,680,959 | B2 | 1/2004 | Tanabe et al. |
| 6,798,811 | B1 * | 9/2004 | Sugahara et al. .......... 372/49.01 |
| 7,057,211 | B2 | 6/2006 | Dwilinski et al. |
| 7,285,799 | B2 * | 10/2007 | Kim et al. ........................ 257/79 |
| 7,292,615 | B2 | 11/2007 | Sugahara et al. |
| 7,315,559 | B2 | 1/2008 | Dwilinski et al. |
| 2005/0059181 | A1 | 3/2005 | Yamane et al. |
| 2006/0251137 | A1 * | 11/2006 | Sung et al. ................. 372/46.01 |
| 2007/0025231 | A1 | 2/2007 | Ochiai et al. |
| 2007/0054431 | A1 | 3/2007 | Kamikawa et al. |
| 2007/0080368 | A1 | 4/2007 | Kamikawa et al. |
| 2007/0147448 | A1 | 6/2007 | Bessho et al. |
| 2007/0205424 | A1 | 9/2007 | Kamikawa et al. |
| 2007/0210324 | A1 | 9/2007 | Kawaguchi et al. |
| 2007/0298528 | A1 | 12/2007 | Yamane et al. |

FOREIGN PATENT DOCUMENTS

| JP | H09-162496 A | 6/1997 |
| JP | H09-162497 A | 6/1997 |
| JP | H09-283843 A | 10/1997 |
| JP | H10-070338 A | 3/1998 |
| JP | 2002-100830 A | 4/2002 |

(Continued)

*Primary Examiner* — Patrick Stafford
(74) *Attorney, Agent, or Firm* — Global IP Counselors, LLP

(57) ABSTRACT

A nitride semiconductor laser element includes a nitride semiconductor layer of a first conduction type, an active layer, and a nitride semiconductor layer of a second conduction type that is different from the first conduction type are laminated in that order, a cavity end face formed by the nitride semiconductor layers, and a protective film formed on the cavity end face. The nitride semiconductor layers of the first and second conduction types have layers containing Al, and the active layer has layer containing In. The protective film has a region in which an axial orientation of crystals is the same as that of the cavity end face on the nitride semiconductor layers of the first and second conduction types, and has another region in which an axial orientation of crystals is different from that of the cavity end face on the active layer.

20 Claims, 9 Drawing Sheets

| | FOREIGN PATENT DOCUMENTS | | |
|---|---|---|---|
| JP | 2002-329926 A | 11/2002 | |
| JP | 2002-335053 A | 11/2002 | |
| JP | 2004-327637 A | 11/2004 | |
| JP | 2005-079406 A | 3/2005 | |
| JP | 2005-101457 A | 4/2005 | |
| JP | 2006-024703 A | 1/2006 | |
| JP | 2006-228892 A | 8/2006 | |
| JP | 2007-059732 A | 3/2007 | |
| JP | 2007-103814 A | 4/2007 | |
| JP | 2007-150004 A | 6/2007 | |
| JP | 2007-201412 A | 8/2007 | |
| JP | 2007-273951 A | 10/2007 | |
| JP | 2007-273953 A | 10/2007 | |
| WO | WO-03-036771 A | 5/2003 | |

* cited by examiner

NITRIDE SEMICONDUCTOR LASER ELEMENT

CROSS-REFERENCE TO RELATED APPLICATIONS

This application is a divisional application of U.S. patent application Ser. No. 12/166,746 filed on Jul. 2, 2008, now pending. This application claims priority to Japanese Patent Application Nos. 2007-178915, 2007-222613 and 2008-161731. The entire disclosures of U.S. patent application Ser. No. 12/166,746, and Japanese Patent Application Nos. 2007-178915, 2007-222613 and 2008-161731 are hereby incorporated herein by reference.

BACKGROUND OF THE INVENTION

1. Field of the Invention

The present invention relates to a nitride semiconductor laser element, and more particularly relates to a nitride semiconductor laser element having a protective film of a specific structure on a cavity end face.

2. Background Information

With a nitride semiconductor laser element, end faces of the cavity formed by RIE (reactive ion etching) or cleavage has narrow bandgap energy, so absorption of the exiting light occurs at the end face, this absorption generates heat at the end face, and problems such as a short service life are encountered in trying to obtain a high-output laser. Consequently, there has been proposed, for example, a method for manufacturing a high-output semiconductor laser in which a silicon oxide or nitride film is formed as a protective film on the cavity end face (see, for example, Japanese Laid-Open Patent Application H10-70338). This protective film functions as a window layer, and suppresses the absorption of light at the cavity end face.

However, with a nitride semiconductor laser element, even if the protective film is made from a material capable of suppressing the absorption of light at the cavity end face, there will still be a problem in that the desired function cannot be achieved because the protective film separates or cracks develop in the laminated nitride semiconductor layers due to a difference in the lattice constants of the nitride semiconductors.

SUMMARY

Figure 1:
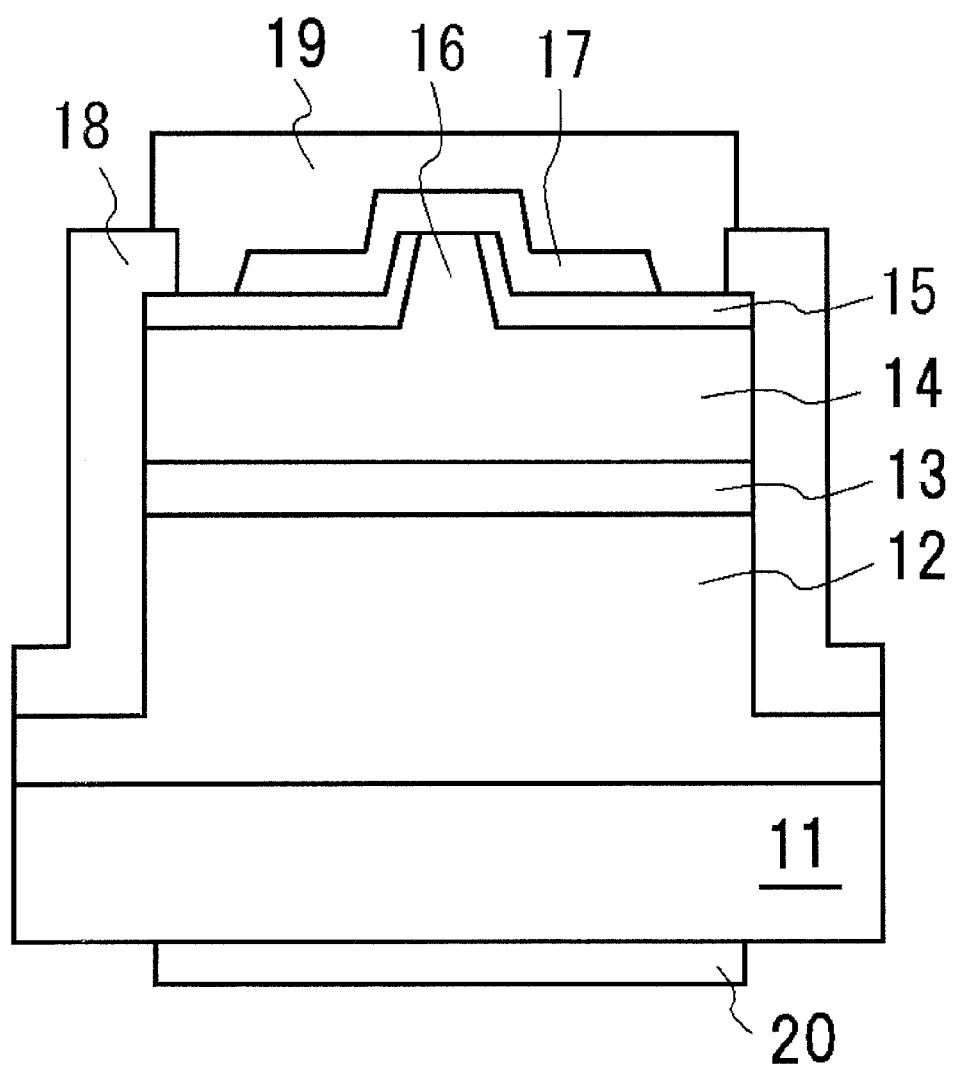
FIG. 1 is simplified cross section illustrating the structure of the laser elements of the present invention.

The present invention was conceived in light of this problem, and it is an object thereof to provide a nitride semiconductor laser element that has good characteristics, with which the generation of cracks in the nitride semiconductor layer is suppressed, and no separation of the protective film occurs at the end face.

One aspect of the present invention provides a nitride semiconductor laser element including nitride semiconductor layers, a cavity end face and a protective film. The nitride semiconductor layers has a nitride semiconductor layer of a first conduction type, an active layer, and a nitride semiconductor layer of a second conduction type that is different from the first conduction type are laminated in that order. The cavity end face is formed by the nitride semiconductor layers. The protective film is formed on the cavity end face. The nitride semiconductor layer of the first conduction type and the nitride semiconductor layer of the second conduction type have a layer containing Al, and the active layer has a layer containing In. The protective film has a region in which an axial orientation of crystals is the same as that of the cavity end face on the nitride semiconductor layer of the first conduction type and the nitride semiconductor layer of the second conduction type, and has another region in which an axial orientation of crystals is different from that of the cavity end face on the active layer.

Further, another aspect of the present invention provides a nitride semiconductor laser element including nitride semiconductor layers, a cavity end face and a protective film. The nitride semiconductor layers has a nitride semiconductor layer of a first conduction type, an active layer, and a nitride semiconductor layer of a second conduction type that is different from the first conduction type are laminated in that order. The cavity end face is formed by the nitride semiconductor layers. The protective film is formed on the cavity end face. The nitride semiconductor layer of the first conduction type and the nitride semiconductor layer of the second conduction type have a layer containing Al, and the active layer has a layer containing In. The protective film has a region in which an axial orientation of crystals is different from that of a contact interface of the nitride semiconductor layers at the cavity end face with respect to the direction of lamination of the protective film.

With the above aspects of present invention, a protective film formed on a cavity end face is disposed so as to have a region of different crystal axial orientation in the lamination direction of the nitride semiconductor layers, the result being that even during high-output drive of the nitride semiconductor laser element, load on the semiconductor layer due to stress of the protective film is reduced, that is, fewer cracks develop in the nitride semiconductor layer, and it is possible to prevent separation of the protective film, etc. Accordingly, a high COD (Catastrophic Optical Damage) level can be maintained without any change occurring over time, and a nitride semiconductor laser element with high performance, high output, and high reliability can be provided.

DETAILED DESCRIPTION OF THE EMBODIMENTS

The inventors conducted diligent research into protective films for cavity end faces in order to obtain good characteristics, and particularly a higher COD level, even under high-output drive, so that a nitride semiconductor laser element with higher reliability could be obtained. As a result, they discovered that the orientation of the protective film itself affects such things as separation of the protective film and the load on the semiconductor layer due to stress of the protective film, and more particularly that there are changes over time in high-output drive. In other words, although the COD level is high at the start of drive when the orientation of the protective film is uniform, the COD level decreases over time due to such factors as separation of the protective film and load on the semiconductor layer as the drive output rises.

Also, they discovered that, when there is a great difference between lattice constant of the cavity end face which is an exposure face of the stacked nitride semiconductor layers and lattice constant of the protective film formed on the cavity end face, the COD level decreases because the protective film formed on the cavity end face is generated a light absorbing region composed of polycrystalline and the like therein. This is affected by the property of the protective film formed on a light waveguide region which is formed within the nitride semiconductor layers, and particularly an active layer.

This revealed that adjusting the orientation/lattice constant of the protective film allows the characteristics of a semiconductor laser element to be maintained over an extended period, and this led to the perfection of the present invention.

Figure 2A:
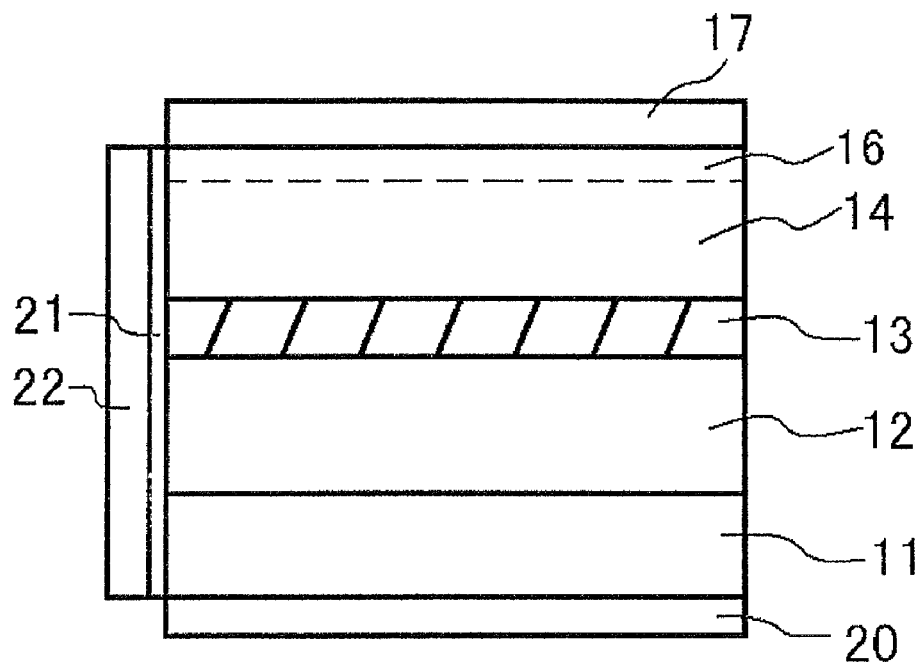
FIGS. 2A to 2C are simplified diagrams illustrating the structure of the first protective film of the present invention.

As typically shown in FIGS. 1 and 2A, for example, a nitride semiconductor laser element of the present invention mainly includes a semiconductor layers comprising a first nitride semiconductor layer 12, an active layer 13, and a second nitride semiconductor layer 14 in this order, and cavity end faces disposed on opposed end faces of the semiconductor layers.

This nitride semiconductor laser element is usually formed on a substrate 11, a ridge 16 is formed on the surface of the second nitride semiconductor layer 14, and a first protective film 21 and a second protective film 22 are formed. Further, an embedded film 15, a p-side electrode 17, an n-side electrode 20 are formed. As shown in FIG. 1, an third protective film 18, a p-side pad electrode, and so forth are formed.

Figure 2B:
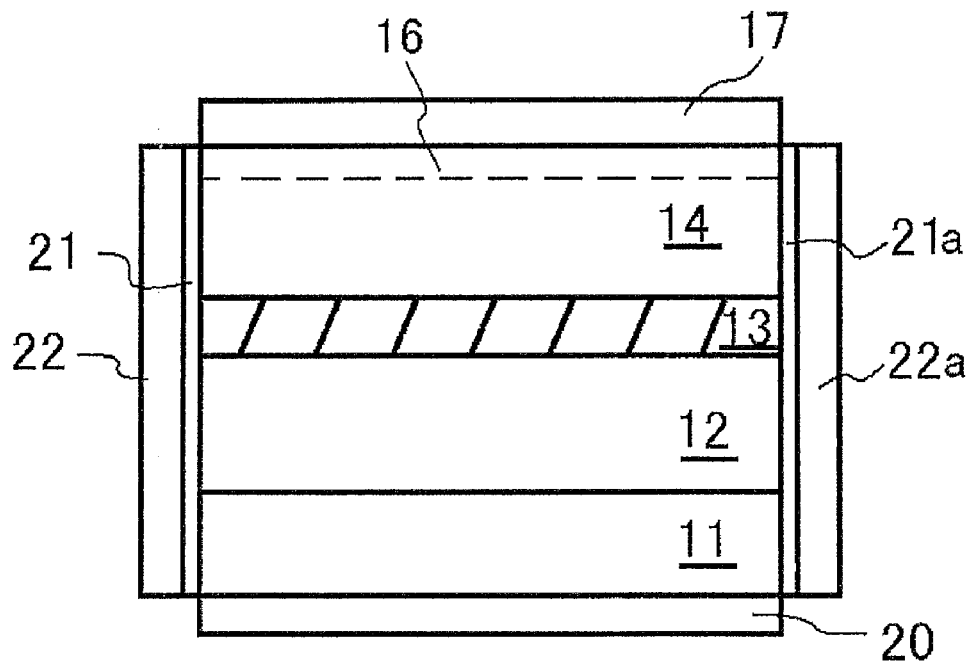
Figure 2C:
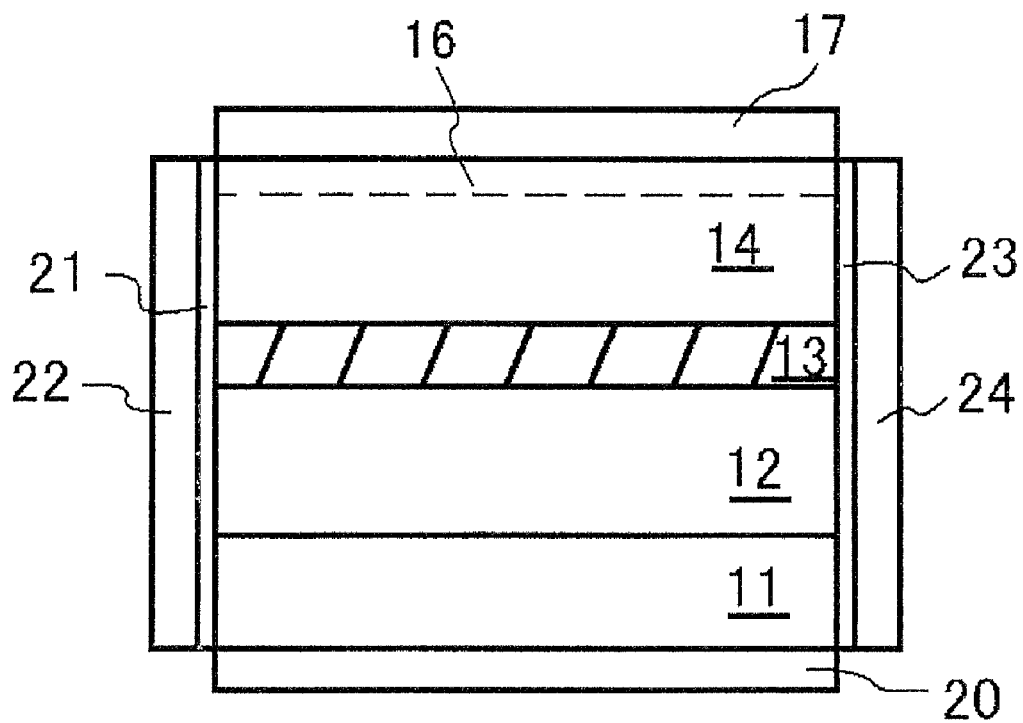

As shown in FIGS. 2A, 2B, and 2C, the first protective film is a film formed in contact with at least one cavity end face (and particularly the end face where light exits, hereinafter sometimes referred to as a "front side"). In this specification, hereinafter, the protective film will also be referred to as a "first protective film" and the first and second protective films which are formed on the cavity end face will be referred to as an "end face protective film." This first protective film has a region in which the axial orientation of the crystals is different in the direction of lamination of the nitride semiconductor layers. That is, the first protective film does not have a uniform crystal axial orientation in the in-plane, and the axial orientation instead varies. Combinations of such difference axial orientations in the in-plane encompasses various possibilities, such as a M axis ⟨1-100⟩ orientation region and a C axis ⟨0001⟩ orientation region, or the M axis orientation region and an A axis ⟨11-20⟩ orientation region, or the M axis orientation region and the R axis ⟨1-102⟩ orientation region, or the C axis orientation region and the A axis orientation region, or the C axis orientation region and the R axis orientation region, or the A axis orientation region and the R axis orientation region, or the like.

Also, the first protective film may not have a uniform crystal axial orientation in the direction of the thickness, and the axial orientation instead varies. Combinations of the such difference axial orientations in the direction of the thickness, similar to the difference in the axial orientation in-plane, encompasses various possibilities, such as a change from the M axis ⟨1-100⟩ to the C axis ⟨0001⟩, or a change from the M axis to the A axis ⟨11-20⟩, or a change from the M axis to the R axis ⟨1-102⟩, or a change from the C axis to the A axis, or a change from the C axis to the R axis, or a change from the A axis to the R axis, from the cavity end face side to a surface side or in the reverse direction thereof.

The phrase "axis orientation" here is not strictly limited to a state in which a single crystal is oriented along the M axis, C axis, A axis, or R axis, and may encompass a state in which polycrystalline are also present, but a region (also, portion(s) or part(s)) oriented along the M axis, C axis, A axis, or R axis are included uniformly, or a state in which these are uniformly dispersed. When there is thus a polycrystalline state, there will not be a clear difference in the lattice constant from that of the cavity end face, and this difference can be lessened.

This change in the axial orientation need not be a change to a completely different axial orientation, and may instead be a situation in which different axial orientations coexist, or in which the proportion of a different axial orientation becomes higher.

The axial orientation of the crystal in the first protective film is preferably so as to have a region where the axial orientation of the crystal is different from that of the cavity end face at the contact interface with the cavity end face.

Because the crystal structure of the first protective film of the present invention is such that there is a region where the axial orientation is different within the in-plane and at least on the contact side with the nitride semiconductor layers, stress is divided at the interface between regions of differing axial orientation, and stress is relieved within the first protective film. Also, at the interface between regions of differing axial orientation, there is a lattice constant differential and a coefficient of thermal expansion differential. This, particularly having the lattice constant differential at the interface between regions of differing axial orientation, relieves stress in the first protective film and thus to the nitride semiconductor layers, prevents the first protective film from separating, and increases the COD level.

The axial orientation of the first protective film can be determined by the composition of the nitride semiconductor layers of the cavity end face. For instance, as will be discussed below, when the nitride semiconductor layer is formed from $In_xAl_yGa_{1-x-y}N$ ($0 \leq x \leq 1$, $0 \leq y \leq 1$), $0 \leq x+y \leq 1$) on the basis of GaN, as the composition of x increases, there is a tendency for the axial orientation of the first protective film to be different from that of the cavity end face. Also, as the composition of y increases, there is a tendency for the axial orientation of the first protective film to be same as that of the cavity end face.

Figure 9:
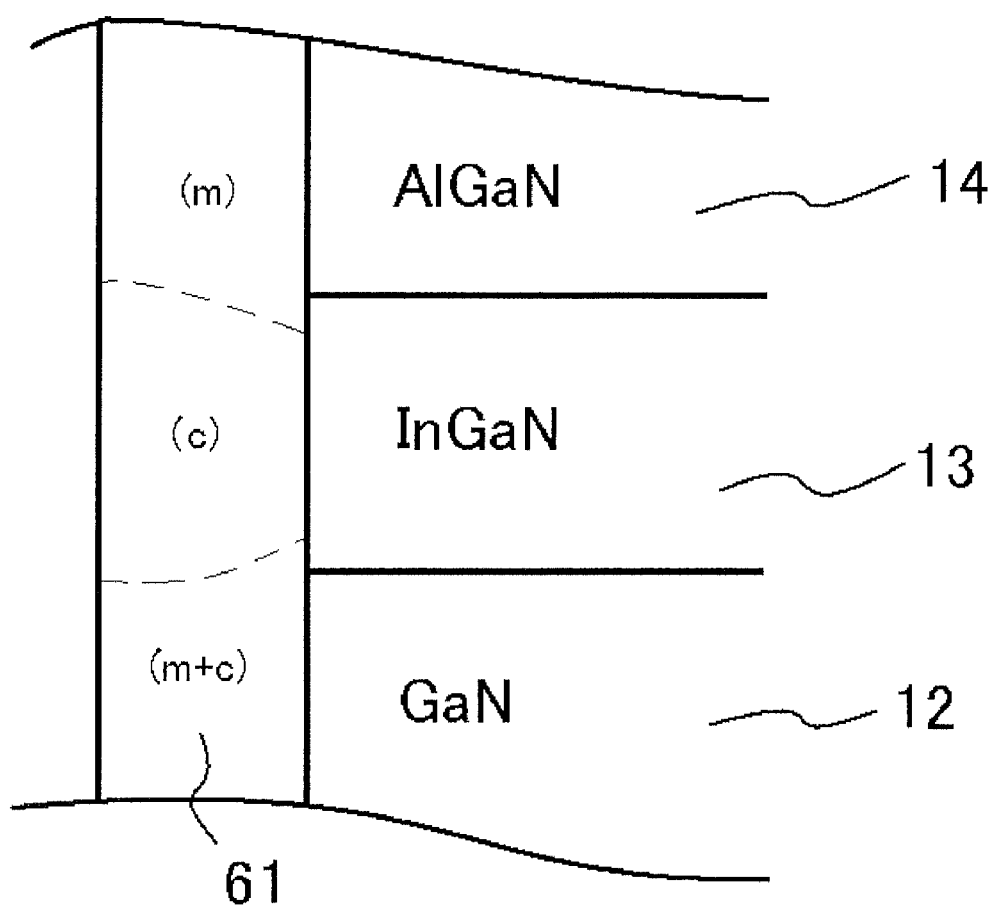
FIG. 9 is a schematic image illustrating the state of axial orientation of still another cross sectional first protective film of the present invention.

More specifically, when the cavity end face is the M plane, that is, when the nitride semiconductor layers are oriented with C axis orientation in the direction of lamination of the nitride semiconductor layers, as shown in FIG. 9, M axial orientation and C axial orientation are fairly well mixed in the region of the first protective film 61 in contact with the GaN layer that is part of the nitride semiconductor layers constituting the cavity end face.

If indium proportion for only a tiny part of the InGaN layer, then the properties of the GaN layer will be dominant in the first protective film, and while M axial orientation and C axial orientation will be fairly well mixed in the first protective film, as the proportion of indium increases, the properties of the indium will gradually come out in the first protective film, and the indium properties will eventually become dominant, so that a region appears in which substantially only C axial orientation is present in the first protective film (See FIG. 9).

The point at which the indium properties appear here can be suitably adjusted by means of the film formation method or the film thickness, for instance, but an example of the indium proportion x is a range of about 0.01 to 0.30, and preferably about 0.01 to 0.20, and more preferably about 0.02 to 0.07.

In the case of an AlGaN layer, as the proportion of aluminum increases, the properties of the aluminum gradually appear in the first protective film, and eventually aluminum properties become dominant, so that a region appears in which substantially only M axial orientation is present in the first protective film (see FIG. 9). The point at which the aluminum properties appear here can be suitably adjusted by means of the film formation method or the film thickness, for instance, but an example of the aluminum proportion y is a range of about 0.0001 or more, and preferably about 0.001 or more, and still preferably about 0.01 or more.

The term "dominant" as used here indicates both that the proportion is higher and that the properties are more pronounced compared to those of others.

In FIG. 9, interfaces between a C axial orientation region and a M axial orientation region, the C axial orientation and a (M+C) axis orientation region are indicated by dotted line, but the location of the dotted line can be shifted depend on the indium or aluminum proportions in each nitride semiconductor layer. This allows the first protective film in contact with the nitride semiconductor layer which does not directly contribute to a light emission to adhere well to the nitride semiconductor layer, whereas it is possible to suppress the absorption of light at the first protective film in contact with the nitride semiconductor layer which does directly contribute to a light emission.

In particular, when the nitride semiconductor layer has an $In_xGa_{1-x}N$ ($0<x\leq1$) layer, the $In_xGa_{1-x}N$ ($0<x\leq1$) layer usually has a crystal structure with C axial orientation in the lamination direction of the nitride semiconductor layer, and the first protective film has a crystal structure with C axial orientation in the direction perpendicular to the cavity end face.

However, the axis orientation of the laminated nitride semiconductor layers not necessarily may be partially or all of the same as that of the first protective film at the contact interface between them.

From another standpoint, when the nitride semiconductor layer is formed from $In_xAl_yGa_{1-x-y}N$ ($0\leq x\leq1$, $0\leq y\leq1$, $0\leq x+y\leq1$), on the basis of GaN, a region in which substantially only C axial orientation is present can be obtained in the first protective film by setting the bandgap energy of the nitride semiconductor layers to be the same or lower. Also, a region in which substantially only M axial orientation is present can be obtained in the first protective film by setting the bandgap energy of the nitride semiconductor layers to be higher.

From yet another standpoint, when the nitride semiconductor layer is formed from $In_xAl_yGa_{1-x-y}N$ ($0\leq x\leq1$, $0\leq y\leq1$, $0\leq x+y\leq1$), on the basis of GaN, a region in which substantially only C axial orientation is present can be obtained in the first protective film by setting the lattice constant of the nitride semiconductor layer to be the same or larger. Also, a region in which substantially only M axial orientation is present can be obtained in the first protective film by setting the lattice constant of the nitride semiconductor layer to be smaller, on the basis of GaN.

That is, if the difference between the lattice constant of the well layers that make up the active layer and the lattice constant of the first protective film is to be reduced, then the axial orientation of the first protective film may be different from the axial orientation of the well layer exposed at the cavity end face, in other words, these may not be lattice-matched. If the difference between the lattice constant of the nitride semiconductor layer exposed as the cavity end face and the lattice constant of the first protective film formed at the cavity end face is reduced, it is believed that optical absorption can be suppressed at the contact interface between these, and that the COD level can thus be increased.

Also, the first protective film may be lattice-matched to the nitride semiconductor layer. However, there is no need for lattice matching over the entire contact interface between the nitride semiconductor layer and the first protective film.

This differences in axial orientation within the in-plane of the first protective film is, in one embodiment, believed to appear or vary due to the axis orientation of the nitride semiconductor itself contact with the first protective film or composition as well as a difference in bandgap, or in lattice constant, or in the thickness or in the composition of the nitride semiconductor layer of the adjacent the first protective film. Therefore, these variation and differences in axial orientation of the first protective film tend to occur at the lamination interface of the nitride semiconductor layer and in the vicinity thereof.

For example, when the nitride semiconductor layer is an InGaN layer, and an AlGaN layer is disposed on one side thereof, the first protective film in contact with the InGaN layer tends to be affected by the adjacent AlGaN layer, and it has been confirmed that as the aluminum content rises, the effect of the AlGaN layer increases.

Therefore, the change in axial orientation and the differences of the axial orientation in the in-plane of the first protective film need not necessarily occur at all the lamination interfaces of the nitride semiconductor layers.

More specifically, the differences of the axial orientation in the in-plane of the first protective film tends to form at the interface with the active layer and the nitride semiconductor layer of the first conduction type, and at the interface with the active layer and the nitride semiconductor layer of the second conduction type. Also, if the active layer has a quantum well structure, this difference tends to form at one or more interfaces with barrier layer and the well layer, and at the interface with the outermost barrier layer and the well layer and in the vicinity thereof easily. Stress can be relieved in the first protective film by having the axial orientation in the in-plane of the first protective film be different at the active layer or on the optical waveguide including the active layer, from that at the nitride semiconductor layer laminated above and below the active layer, on the cavity end face formed by the nitride semiconductor layers.

Over the cavity end face formed in the nitride semiconductor layers, the axial orientation in the in-plane of the first protective film is preferably different from that of the cavity end face at the active layer or on the optical waveguide including the active layer, and preferably at the well layer and in the vicinity of the barrier layer laminated above and below the well layer, and is preferably the same as that of the cavity end face at the nitride semiconductor layer laminated above and below the active layer. Having the axial orientation be the same as that of the cavity end face over the nitride semiconductor layer laminated above and below results in good adhesion between the first protective film and the nitride semiconductor layer. Also, if the first protective film is formed with different axial orientation from that of the cavity end face at the active layer or on the optical waveguide including the active layer, then a region will be formed with different axial orientation in the in-plane direction of the first protective film, which cause an interface between different axial orientation regions, so stress is relieved in the first protective film. As a result, stress attributable to heat caused by irradiation with laser light at the cavity end face, particularly near the active layer, can be relieved by difference of the axial orientation of the first protective film, and this also effectively prevents separation of the first protective film, loading of the nitride semiconductor layer, etc.

When a plurality of well layers is used, the first protective film is preferably formed in a different axial orientation from that of the cavity end face, continuously between the well layers at both ends.

Figure 8:
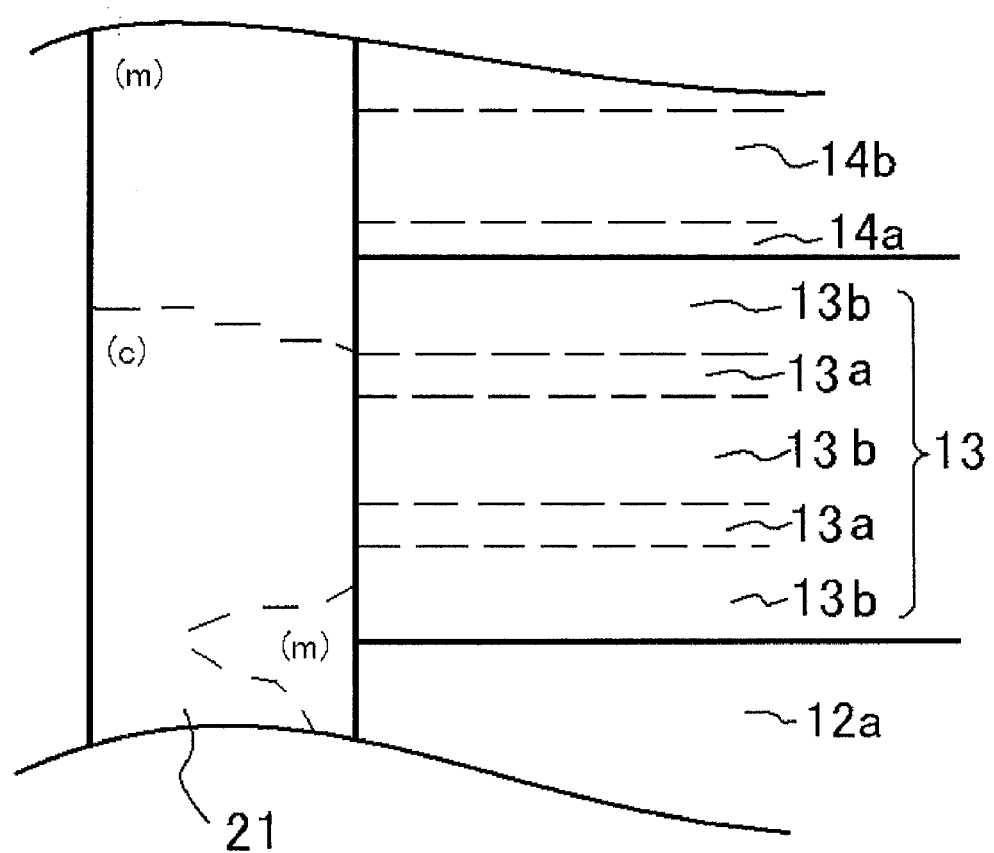
FIG. 8 is a schematic TEM image illustrating the state of axial orientation of still another cross sectional first protective film of the present invention.

In particular, when the active layer has a multiple quantum well structure comprising two or more well layers, it is preferable if the first protective film has the same axial orientation of the crystals, continuously in the lamination direction of the nitride semiconductor layers over the active layer between the well layers located on both sides (see FIG. 8).

Figure 3:
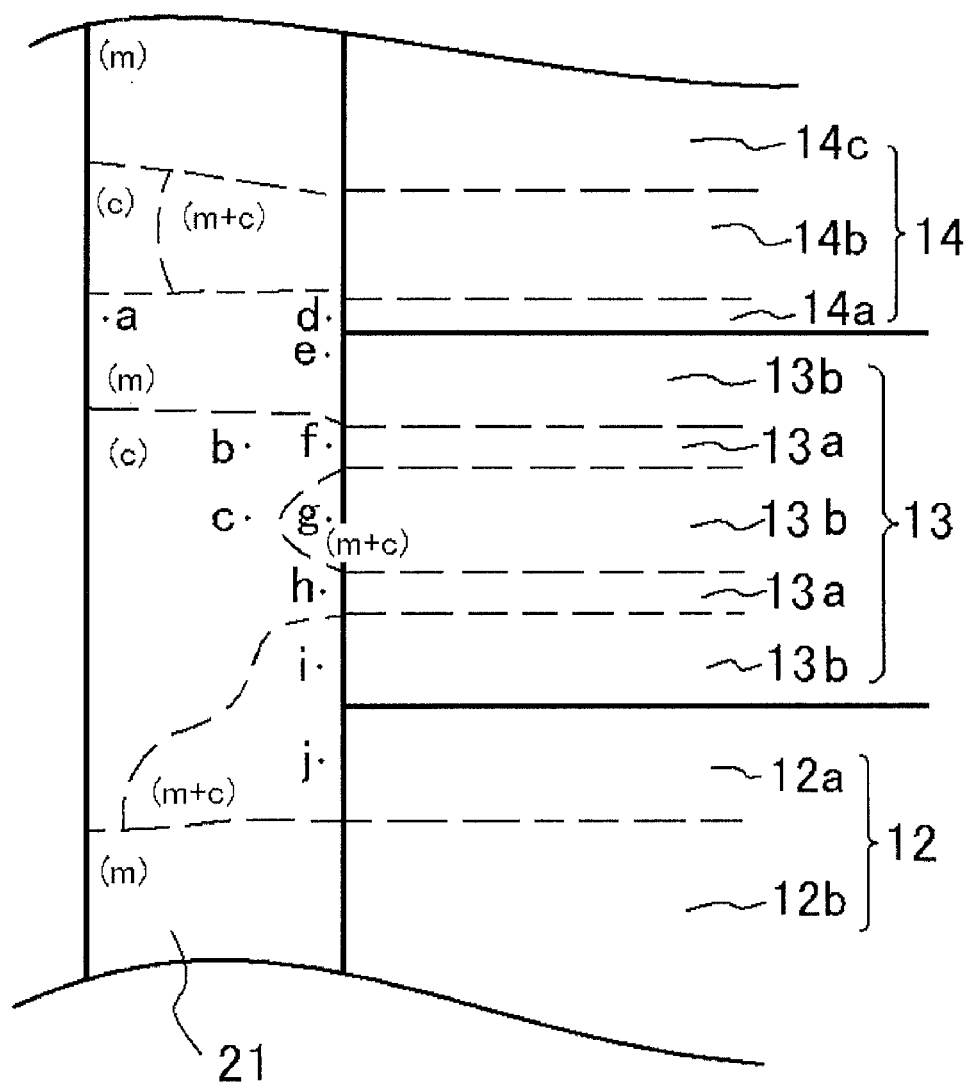
FIG. 3 is simplified a schematic TEM (transmission electron microscope) image illustrating the cross sectional first protective film of the present invention.
Figure 4:
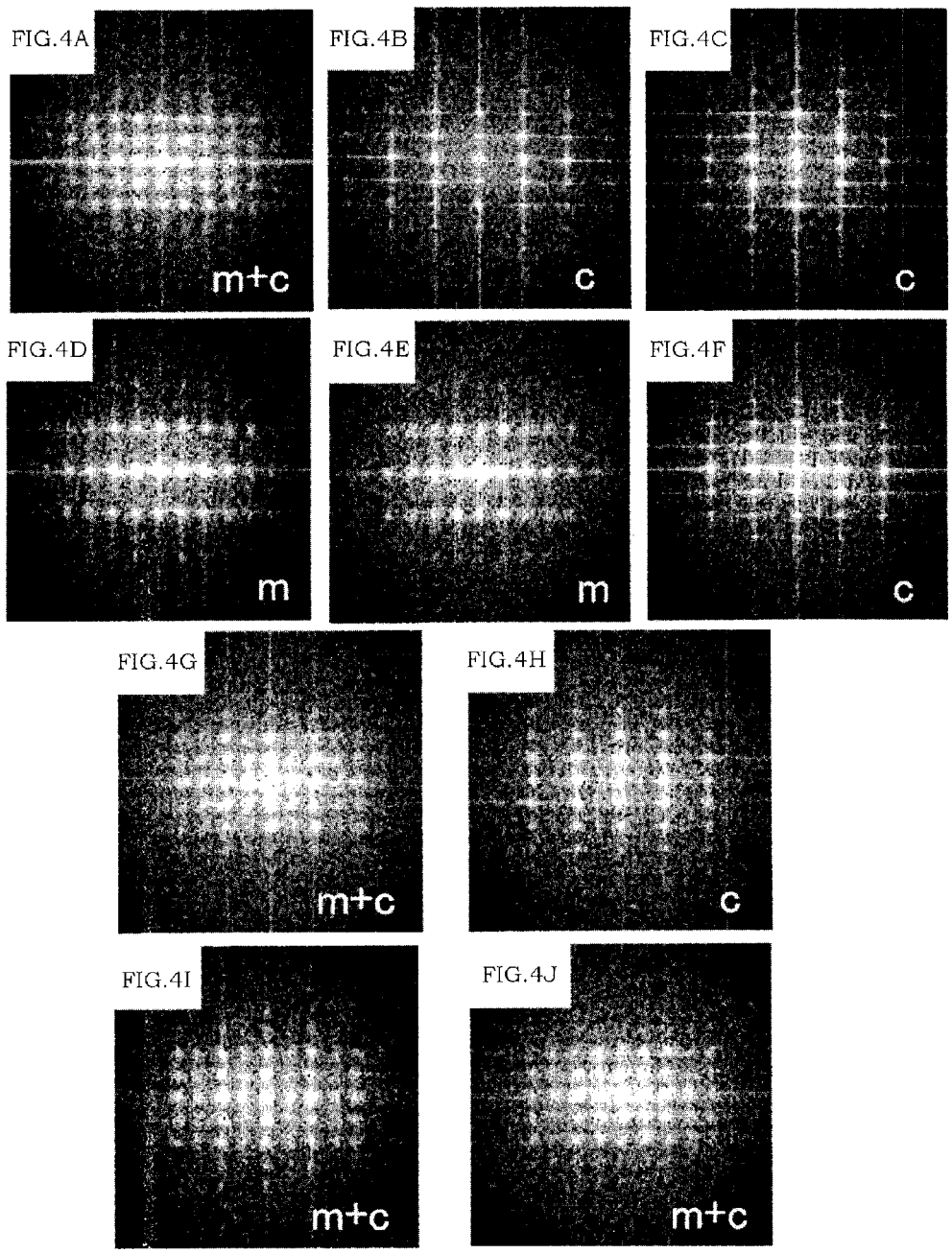
FIGS. 4A to 4J are schematic electron beam diffraction images illustrating the state of axial orientation at the various points on the first protective film shown in FIG. 3.
Figure 6:
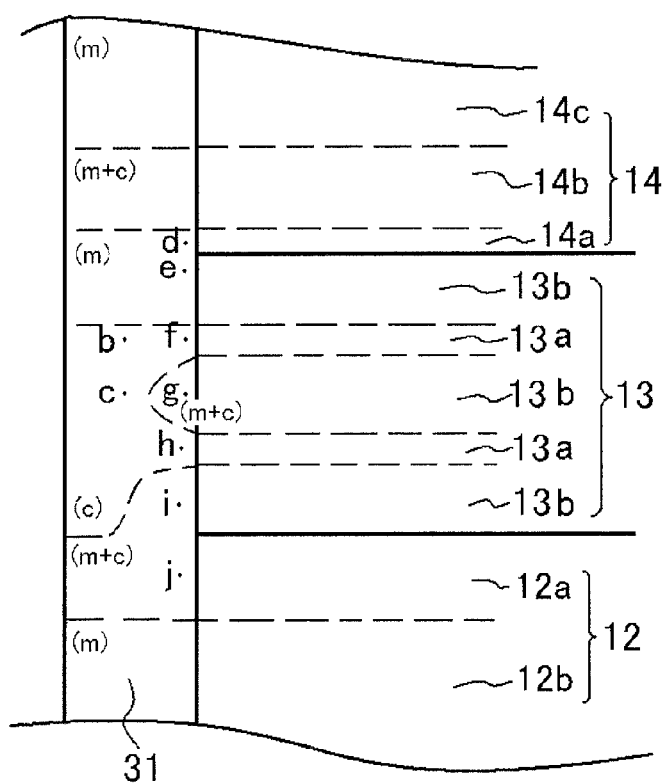
FIG. 6 is a schematic TEM image illustrating the state of axial orientation of another cross sectional first protective film of the present invention.

The first protective film may have a region in which the crystal axial orientation is different from that of the cavity end face in the thickness direction of the first protective film from the contact interface with the well layer (see FIGS. 3 and 6, etc.). This allows stress to be relieved in the thickness direction of the first protective film as well.

The first protective film may be a film composed of oxides (Si, Mg, Al, Hf, Nb, Zr, Sc, Ta, Ga, Zn, Y, B, Ti, etc.), nitrides (AlN, AlGaN, GaN, BN, SiN, etc.) or fluorides and the like. Among these, the first protective film preferably includes the crystal structure of hexagonal system, and composed of AlN.

The protective film may be formed, for example, about 5 to about 500 nm, and preferable about 5 to about 100 nm. Also, the protective film may be formed not only on the end face where light exits (front side) of the cavity, but also on the end face where light reflects (hereinafter sometimes referred to as a "rear side" which is the face on the opposite side).

The state of the first protective film is generally classified as monocrystalline, polycrystalline, or amorphous, depending on the degree of crystallization of the material that makes up the film. Monocrystallines have almost no variation in lattice constant among materials, and there is almost no lattice plane inclination. To put this another way, the atoms in the material are arranged in a regular pattern, and order is maintained over an extended distance. Polycrystallines are made up of numerous microscopic monocrystallines, i.e., microcrystallines. An amorphous material is one that has no periodic structure such as that in a crystal, that is, it means that the atomic arrangement is irregular and there is no order over an extended distance.

The state of the film (crystalline or a crystal state in the case of a crystal substance) can be easily evaluated from a diffraction image produced by electron beam. How the elements that make up the crystals are arranged can be grasped visually from the resulting electron beam diffraction image.

That is, an electron beam is directed at the film, and an electron beam diffraction image appears corresponding to the planar direction and the size of the lattice constant. For instance, in the case of a monocrystalline, since the crystal planes are almost aligned, the diffraction points are observed to align with good regularity. In the case of a polycrystalline, since it is made up of microcrystals, the lattice planes are not all facing the same way, and the diffraction points may come together in a complex fashion, or Debye rings may be seen. In the case of an amorphous material, meanwhile, since the atomic arrangement does not have a periodic structure over an extended distance, no electron beam diffraction occurs. Therefore, this is observed as a state in which the diffraction image has no diffraction points.

That crystallinity is different, and that the axial orientation of the crystal structure is different can be confirmed not only by TEM, STEM (Scanning Transmission Electron Microscope), SEM (Scanning Electron Microscope), and other kinds of cross section observation (bright field, selected-field, high resolution and the like), but also by electron beam diffraction or the product of subjecting these patterns to FFT (Fast Fourrier Transform), or from the difference in the etching rate.

In other words, in observing a protective film under a microscope, a difference can be visually ascertained, which is due to a difference in crystallinity, between a region adjacent the active layer and a region in contact with the first and second nitride semiconductor layers.

In particular, in observation by STEM, TEM or the like, a contrast (bright or dark) is observed due to the different states of the film (crystalline or a crystal state in the case of a crystal substance).

Also, even when the same film is observed, contrast will sometimes be observed to be inverted when the observation conditions (STEM or TEM image display settings) are changed.

An electron beam diffraction image can be observed by cutting the protective film so that a cross section is exposed with respect to the end face where the protective film is formed, and directing an electron beam at this cross section. The electron beam diffraction image observation can be carried out, for example, using a JEM-2010F made by JEOL.

Observation is conducted by the following procedure. First, a specimen is cut out by microprobing using a focused ion beam (FIB) machining apparatus (for example, SMI3050MS2 made by Seiko Instruments Inc.), and a thin film (for example, at least about 100 nm) is obtained by subjecting the specimen to FIB machining. Further thin film (for example, at least about 50 nm) working is performed by ion milling. Then, a dark field image can be obtained by performing TEM observation at a prescribed acceleration voltage (for example, about 200 kV).

Furthermore, if the first protective film thus obtained is immersed in a suitable etchant, such as an acid solution (for example, buffered hydrofluoric acid or the like) or alkali solution (for example, KOH or the like), a difference in crystallinity can be discerned from a difference in solubility (etching rate difference). In this etching, a material with poor crystallinity will be quickly dissolved or removed, while a material with good crystallinity will remain or be preserved.

These are not the only methods that can be used, and the crystallinity of the first protective film can be evaluated using any known method.

The first protective film can be formed, for example, by a method that is known in this field. For instance, this can be vapor deposition, sputtering, reactive sputtering, ECR (electron cyclotron resonance) plasma sputtering, magnetron sputtering, ion beam assist deposition, ion plating, laser ablation, CVD (Chemical Vapor Deposition), spraying, spin coating, dipping, a combination of these two or more methods, a combination of these methods and oxidation treatment (thermal treatment), or any of various other methods, and preferably ECR plasma sputtering.

Although it will depend on the film formation method, it is preferable to control film formation by subjecting the end face of the cavity to a nitrogen plasma treatment prior to film formation, or to adjust the film formation rate to a relatively first rate, or to control the atmosphere during film formation (to reduce a nitrogen gas partial pressure to the extent that the protective film does not have absorption, for example), or to adjust the film formation pressure to a relatively high level, etc. Two or more of these methods may also be combined.

Also, the nitrogen partial pressure may be gradually or abruptly changed during the film formation in each method, or the film formation pressure may be gradually or abruptly changed.

Examples include a method in which, in forming a film by sputtering using the first protective film material as a target, the film formation rate is gradually or suddenly increased, or the RF power is gradually or suddenly increased (with the range of increase being about 100 to 1000 W), or the distance between the target and the substrate is gradually or suddenly changed (with the range of change being about 0.2 to 3 times the original distance), and a method in which the pressure is gradually or suddenly decreased (with the range of decrease being about 0.1 to 2.0 Pa) in forming a film using the first protective film material as a target.

For example, to obtain a film by using ECR plasma sputtering method, it is preferably to adjust a film at a film formation rate of 0.5 to 10 nm/min. The microwave power is preferably 300 to 1000 W, the RF power is 100 to 1000 W.

Also, a method in which the temperature of the substrate is gradually or suddenly increased or lowered (with the range of change being about 50 to 500° C.) may be used. Then, thermal treatment may be performed.

When an AlN film is formed by ECR sputtering, if the cavity end face is the M plane, orientation of the film can be along the M axis (coaxial) and the C axis (stable). The film formation rate has to be controlled in order to control the orientation of the film, and M axial orientation is more easily continued if the film formation rate is lowered. Examples of ways to lower the film formation rate include lowering the RF power, lowering the film formation gas pressure, and raising the nitrogen gas partial pressure. It is also possible to form AlN with partial M axial orientation and C axial orientation by raising the film formation rate by raising the RF power, lowering the film formation gas pressure, lowering the nitrogen gas partial pressure, etc. It is preferable for an AlN film to be formed such that, depending on these conditions, the axial orientation of crystals in the lamination direction of the nitride semiconductor layers is different in M axial orientation and C axial orientation in the first protective film formed on the cavity end face. This relieves stress to the nitride semiconductor, prevents the first protective film from separating, and allows the COD level to be kept high even after high-output drive.

Furthermore, these methods can be combined as desired.

Examples of preferable conditions for forming the first protective film include a film formation rate of about 2.5 to 10 nm/min, a microwave power of 400 to 1000 W, and an RF power of about 400 to 1000 W. The use of argon, krypton, xenon, or another such rare gas is preferable for the atmosphere gas. When a film of AlN is to be formed, it is preferable to use an aluminum target and set the flow of nitrogen (nitrogen raw material) to between about 3 and 8 sccm, and the flow of atmosphere gas to between about 25 and 50 sccm. Furthermore, differences in axial orientation and/or lattice constant in the in-plane and/or thickness direction of the first protective film can be achieved by combining and suitably adjusting these parameters.

In the nitride semiconductor laser of the present invention, it is preferably formed a second protective film 22 on the first protective film 21 as the end face protective film, as shown in FIG. 2A. The second protective film can make the first protective film to be more forcibly adhered into the cavity end face.

The second protective film may be a film composed of oxides of Si, Mg, Al, Hf, Nb, Zr, Sc, Ta, Ga, Zn, Y, B, Ti, etc., preferably be a film composed of $SiO_2$.

The second protective film may be has any of single layer or laminated structure. The second protective film is preferably an amorphous film. This divides the stress at the interface where the axial orientation of the crystals formed by the first protective film is different, allows stress to be released better, and improves the adhesion of the first protective film.

The thickness of the second protective film is preferably greater than the thickness of the above-mentioned first protective film. For example, the combined thickness of the above-mentioned first protective film and the second protective film may be 0.1 to 2 µm or less. The result is that the above-mentioned effects are more pronounced.

As shown in FIGS. 2B and 2C, the first protective film and/or the second protective film may be made of different materials, have different thicknesses, etc., on the exit side and the reflecting side. The second protective film on the exit side is preferably formed from a single layer of $SiO_2$. Examples of the second protective film on the reflecting side include a laminated structure of $SiO_2$ and $ZrO_2$, and a laminated structure of $Al_2O_3$ and $ZrO_2$. The lamination period and so forth can be adjusted as needed, according to the desired reflectivity.

The amorphous second protective film is similar to the above-mentioned first protective film in that it can be formed by any of the known methods listed above, etc. In particular, to create an amorphous film, although it will depend on the film formation method, it is preferably to control film formation by adjusting the film formation rate to be faster, or controlling the atmosphere during film formation to be an oxygen atmosphere, or adjusting the film formation pressure higher, or the like, or by combining two or more of these methods. When an oxygen atmosphere is used, the oxygen is preferably introduced to the extent that absorption is not induced. Specific film formation conditions are preferably such that the film is formed using a silicon target in an ECR plasma sputtering device, at an oxygen flow of 3 to 20 sccm, a microwave power of 300 to 1000 W, and an RF power of about 300 to 1000 W.

In the present invention, a substrate for forming the nitride semiconductor laser may be an insulating substrate or a conductive substrate. The substrate is, for example, preferably a nitride semiconductor substrate having an off angle of no more than 10° and greater than 0° to the first main face and/or the second main face. The thickness of the substrate is at least 50 µm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy), or the like, a hydrothermal synthesis method in which crystals are grown in a supercritical fluid, a high pressure method, a flux method, a melt method, or the like.

The nitride semiconductor layer may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As.

The n-side nitride semiconductor layer may doped with at least one n-type impurity of IV or VI group elements, such as Si, Ge, Sn, S, O, Ti, Zr, Cd etc. The p-side nitride semiconductor layer may doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. As for the first conductivity and the second conductivity, which may be n-type or p-type. All of layers in the n-type or p-type nitride semiconductor layers may not necessarily contain n-type or p-type impurity.

The nitride semiconductor layers of the first and second conductivity type can be formed as a layer having a function of clad, guide, cap, contact, clack preventing, or the like with a single layer, multilayer, or super lattice structure in position in conjunction with an appropriate structure or composition in order to obtain a semiconductor laser element having a desired characteristics.

Also, at least one of the nitride semiconductor layers of the first and second conductivity type that make up the structure may exhibit n-type or p-type conductivity, all of the layers need to exhibit n-type or p-type conductivity.

The active layer may be a multiple quantum well or single quantum well structure. The active layer preferably comprises a layer which includes indium, and it is suitable that the composition is an average mixed crystal with an indium component of more than 0.5 and 15% or less, and preferably from 0.5 to 10%, and more preferably 0.5 to 7%.

The nitride semiconductor layer preferably has a structure which is a SCH (Separate Confinement Heterostructure) wherein an optical waveguide is constituted by providing n-side and p-side optical guide layers above and below the active layer. However, there is no particular restriction on these structures.

In the nitride semiconductor laser element of the present invention may emits laser light with a wavelength of about 370 to 500 nm, it is possible to prevent separation of the end face protective films and to improve COD level.

There is no particular restriction on a growth method of the nitride semiconductor layer, it can be formed by means of any known method which can grow these nitride semiconductor layers, such as MOVPE (Metal Organic Vapor Phase Epitaxy), MOCVD, HVPE, MBE or the like. In particular, MOCVD is preferable because it allows the nitride semiconductor to be growth with good crystallinity.

A ridge is formed on the surface of the second conductivity type nitride semiconductor layer. The ridge functions as an optical waveguide, the width of the ridge may be from about 1.0 to 30.0 μm, about 1.0 to 8.0 μm, and preferably about 1.0 to 3.0 μn. The height of the ridge (the etching depth) may be, for example, may be from about 0.1 to 2 μm. The extent of optical confinement can be suitably adjusted by adjusting the thickness, material, and so on of the layer that makes up the second conductivity type semiconductor layer. The ridge is preferably set so as to be about 200 to 5000 μm of cavity length. The ridge need not be all the same width in the extension direction of the cavity, and its side faces may be vertical or may be tapered with an angle of about 45 to 90°.

The cavity end face formed by the nitride semiconductor layers may be either the M plane (1-100), A plane (11-20), C plane (0001), or R plane (1-102), but the M plane is preferred. This is because the face can be formed easily and precisely by cleavage.

An embedded film is usually formed on the surface of the nitride semiconductor layer and to the side faces of the ridge. That is, the embedded film is above the nitride semiconductor layer, and is formed in a region other than the region where an electrical connection between the nitride semiconductor layer and an electrode (discussed below) is made. There are no particular restrictions on the position, size, shape, etc., of the region of connection between the nitride semiconductor layer and the electrode, but this region may, for example, be part of the surface of the nitride semiconductor layer, such as substantially the entire top face of the stripe-like ridge formed on the surface of the nitride semiconductor layer.

The embedded film is generally formed from an insulating material with a smaller refractive index than that of the nitride semiconductor layer. The refractive index can be measured using a polarizing ellipsometer (featuring ellipsometry), more specifically, it is, for example, HS-190 made by J. A. WOOLLAM and other ellipsometers. This embedded film is an insulator of a dielectric film of single layer or multilayer film composed of oxides, nitrides or oxide-nitrides of Zr, Si, V, Nb, Hf, Ta, Al, Ce, In, Sb, Zn and the like. The embedded film may have monocrystalline, polycrystalline or amorphous structure. If the embedded film is formed from the side faces of the ridge all the way to the surface of the nitride semiconductor on both sides of the ridge, it will ensure a refractive index difference versus the nitride semiconductor layer, and particularly the second conductivity type semiconductor layer, which allows leakage of light from the active layer to be controlled, allows light to be confined efficiently within the ridge, and also better ensures insulation near the base of the ridge, so the generation of leak current can be avoided.)

This embedded film can be formed by any method that is known in this field. For instance, a variety of methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and oxidation treatment (thermal treatment), or the like.

Electrodes of the nitride semiconductor laser element of the present invention are a pair of the electrode which is electrically connected with the first and second conductivity type nitride semiconductor layers, respectively.

The p-side and an n-side electrodes may preferably be formed with a single layer or laminated layer of a metal or metal alloy of palladium, platinum, nickel, gold, titanium, tungsten, cupper, silver, zinc, tin, indium, aluminum, iridium, rhodium, ITO (Indium Tin Oxide) or the like. The electrodes are suitable formed in a thickness of for example, about 50 to about 500 nm.

The electrode connected with the second conductivity type nitride semiconductor layer is preferably formed over the nitride semiconductor layer and the embedded film.

The electrode connected with the first conductivity type nitride semiconductor layer may be formed either directly on the first conductivity type nitride semiconductor layer, i.e., formed on the same side with a p-side electrode with respect to the substrate, or on the substrate.

A third protective film is preferably formed on the embedded film. This third protective film may be disposed over the embedded film on at least the surface of the nitride semiconductor layer, and preferably also covers the side faces of the nitride semiconductor layer and/or the side faces, surface, etc., of the substrate with or without the embedded film interposed therebetween. The third protective film can be formed from the same materials as those listed as examples for the embedded film. As a result, it is possible to ensure not only insulation reliably but also protection for the exposed side faces, surface, etc., of nitride semiconductor layer.

A conductive layer such as a pad electrode of single layer or laminated layer may be formed on the embedded film, electrode and the third protective film over the side faces of the nitride semiconductor layers up to the top face.

Examples of the nitride semiconductor laser element of the present invention will now be described in detail through reference to the drawings. The present invention is not, however, limited to or by these examples.

Example 1

As shown in FIGS. 1 and 2C, the nitride semiconductor laser element of this Example comprises the first nitride semiconductor layer 12, the active layer 13, and the second nitride semiconductor layer 14 on the surface of which is formed the ridge 16, laminated in that order on the substrate 11, and a cavity is formed therein. With this nitride semiconductor laser element, a first protective film 21 and a second protective film 22 are formed on a light exit side of a cavity end face, and a first protective film 21a and a second protective film 22a are formed on a light reflecting side of the cavity are formed, and also an embedded film 15, a p-side electrode 17, an n-side electrode 20, a third protective film 18, a pad electrode 19 and the like are formed.

The cavity end faces are formed by a nitride semiconductor layers having M axial orientation, and the first protective film is composed of AlN in which the axial orientation is different in the in-plane, i.e., the axial orientation changes in the in-plane, and has a thickness of about 30 nm.

This laser element can be manufactured by the following method (See, FIG. 3).

First, a GaN substrate (not shown) is provided. In a reaction vessel, an n-side clad layer 12b composed of $Al_{0.03}Ga_{0.97}N$ doped with Si at $4\times10^{18}/cm^3$ (2 μm thick) is grown on the GaN substrate at a growth temperature of 1160° C. using trimethylaluminum (TMA), trimethylgallium (TMG) and ammonia ($NH_3$) as the raw material gas with a silane gas for an impurity gas. This n-side clad layer 12b may be composed of a super lattice structure.

Next, the silane gas and TMA is stopped, and n-side wave guide layer 12a composed of undoped GaN (0.175 μm thick) is grown at a growth temperature of 1000° C. This wave guide layer 12a may be doped with n-type impurities.

The temperature is set to 900° C., trimethylindium (TMI) is used, a barrier layer 13b composed of $In_{0.02}Ga_{0.98}N$ doped with Si (14 nm thick) and at same temperature, a well layer 13a composed of undoped $In_{0.07}Ga_{0.93}N$ (8 nm thick) are laminated on the barrier layer 13b. This process is repeated 2 times, finally an undoped barrier layer 13b is formed on the layers to grow an active layer 13 composed of a multiple quantum well structure (MQW)) with a total thickness of 58 nm.

TMI is stopped, a p-side cap layer 14a composed of p-$Al_{0.2}Ga_{0.8}N$ doped with Mg at $1\times10^{20}/cm^3$ (10 nm thick) is grown on the active layer 13 using TMG, TMA, $NH_3$, and $Cp_2Mg$ (bis-cyclopentadienyl magnesium) at a growth temperature of 1000° C. This p-side cap layer 14a can be omitted.

Next, $Cp_2Mg$ gas and TMA are stopped, and p-side wave guide layer 14b composed of undoped GaN (0.145 μm thick) is grown at a growth temperature of 1000° C.

The temperature is set to 1000° C., and an A layer composed of undoped $Al_{0.10}Ga_{0.90}N$ (2.5 nm thick) is grown, and then TMA is stopped and $Cp_2Mg$ gas is used, a B layer composed of GaN (2.5 nm thick) is laminated. The A layer and the B layer are alternately laminated, and this process is repeated to grow a p-side clad layer 14c composed of a super lattice structure with a total thickness of 0.4 μm.

Finally, a p-side contact layer (not shown) composed of GaN doped with Mg at $1\times10^{20}/cm^3$ (15 nm thick) is grown on the p-side clad layer 14c at a growth temperature of 1000° C.

The resulting wafer on which the nitride semiconductor has been grown is taken out of the reaction vessel, and a mask composed of $SiO_2$ is formed on the surface of the p-side contact layer (the outermost layer). And the nitride semiconductor layers are etched using the mask to form a stripe-shaped structure of the nitride semiconductor with a length, which corresponds to cavity length, of 800 μm. This portion will be main body of the cavity in the laser element. The cavity length may be preferably set to the range from 200 to 5000 μm.

Next, a stripe-shaped mask composed of $SiO_2$ is formed on the surface of the p-side contact layer, and the nitride semiconductor layer(s) are etched by RIE (Reactive Ion Etching) method using $SiCl_4$ gas and the stripe-shaped mask. By this means, a stripe-shaped ridge 16 waveguide region is formed with a width of 1.5 μm.

Then, the sides of the ridge are protected by an embedded film 15 composed of $ZrO_2$.

Next, a p-side electrode 17 composed of Ni (10 nm)/Au (100 nm)/Pt (100 nm) is formed on the surface overlying the p-side contact layer and the embedded film. After that, ohmic annealing is performed at 600° C. Subsequently, a third protective film composed of silicon oxide ($SiO_2$: 0.5 μm thick) is formed by sputtering on the embedded film, and on the sides of the semiconductor layer.

Ni (8 nm)/Pd (200 nm)/Au (800 nm) are formed continuously in this order on the exposed p-side electrode that is not covered by the third protective film, to produce a p-side pad electrode 19.

And then, the surface of the substrate which is opposite to the side growing the nitride semiconductor layers is polished so as to have a thickness of 80 μm.

An n-side electrode 20 composed of V (10 nm)/Pt (200 nm)/Au (300 nm) is formed on the polished surface of the substrate.

Next, recessed grooves are formed on the side, on which the n-side electrode 20 is formed, of the substrate in a wafer state having the n-side electrode, the p-side electrode and the p-side pad electrode. These grooves is set to depth of 10 μm, the length of 50 μm in the direction parallel to the end faces of the cavity, from the side surface of the nitride semiconductor layer and the width of 15 μm in the direction perpendicular to the end faces. The cleaving is performed using the recessed grooves from the recessed grooves to produce bars in which the cleavage faces, (1-100) plane, are the cavity end faces.

On the light exit side of the cavity end faces of the obtained element, a first protective film 21 is formed, and then a second protective film 22 is formed on the first protective film.

That is, the first protective film 21 (30 nm) which is composed of AlN is formed at a microwave power of 800 W, RF power of 800 W, and at a film formation rate of 3 nm/min, a an Ar flow of 30 sccm, and a $N_2$ flow of 10 sccm with an ECR plasma sputtering apparatus using an Al target.

Next, on the first protective film formed on the light exit face of the cavity, an $SiO_2$ film is formed as the second protective film 22 in a thickness of 250 nm with a sputtering apparatus using an Si target, at a microwave power of 500 W, RF power of 500 W, and an oxygen flow of 5 sccm.

On the light reflecting side of the cavity, an $Al_2O_3$ film is formed as a protective film 23 in a thickness of 62 nm, $SiO_2$/$ZrO_2$ films are formed as a protective film 24 in a thickness of 67 nm/44 nm with six cycle repetition thereon.

After that, the bar is chipped in the direction perpendicular to the end faces of the cavity to be formed into a chip for a semiconductor laser element.

To check the configuration of the first protective film of the resulting nitride semiconductor laser element, a cross section of the nitride semiconductor laser element was observed under a field emission type of scanning electron microscope (JEM-2010F), and the bright field TEM image was measured. This can be measured by directing an electron beam at the first protective film from the GaN (11-20) plane direction at a camera length of 50 cm.

FIGS. 4A to 4J show the state of axial orientation at the various points on the protective film 21 shown in FIG. 3, as diffraction patterns of the electron beam.

It can be seen from the diffraction patterns of the electron beam in FIGS. 4a to 4j that the first protective film in which the axial orientation is different in the in-plane can be formed on the cavity end face, depending on the nitride semiconductor layer composition, as shown in FIG. 3.

It was also found that as the thickness of the AlN film increases, there is a change to C axial orientation in the region where M axial orientation and C axial orientation are both present. This change to C axial orientation was found to appear at about 5 to 20 nm, depending on the nitride semiconductor layer composition.

Thus, how the elements that make up the crystals of the first protective film are arranged can be visually ascertained from the resulting electron beam diffraction image.

Furthermore, when a film near a cavity end face is observed, diffraction points of the GaN constituting the nitride semiconductor layer may sometimes be observed. In this case, the GaN diffraction points can be separated out before analysis.

The optical output of the resulting semiconductor laser element before and after continuous high-output oscillation was measured at a Tc of 80° C., a Po of 320 mW, and an oscillation wavelength of 405 nm. The results are shown in FIG. 5.

Figure 5:
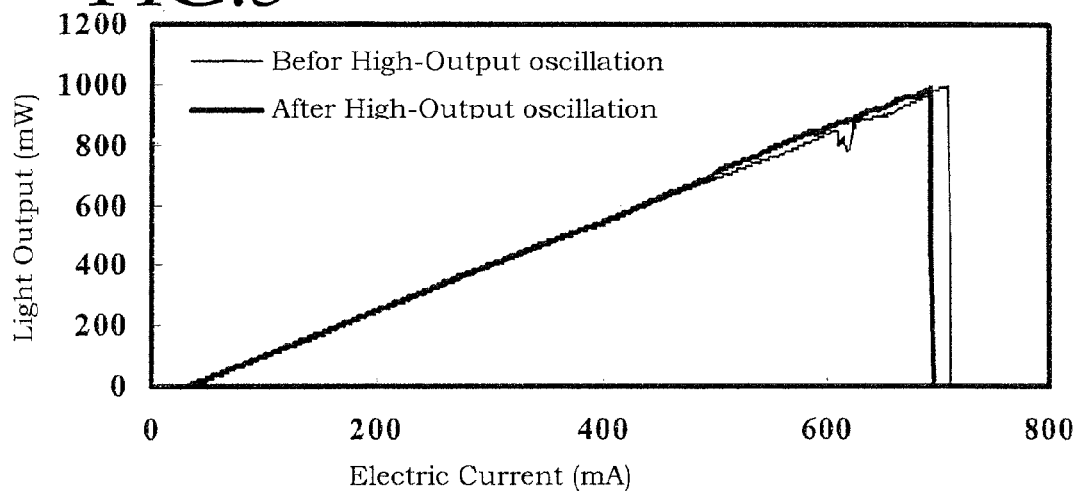
FIG. 5 is a graph showing the relationship of the output-forward current before and after high-output drive of the present invention.

In FIG. 5, the data indicated by the thin line show the current-optical output characteristics before high-output oscillation of the laser element of the present invention, and the data indicated by the thick line show the current-optical output characteristics after continuous high-output oscillation of a laser element.

According to FIG. 5, it can be seen that the COD level is kept high, with almost no change, both before and after continuous high-output oscillation.

Thus, with the nitride semiconductor laser element of this Example, no stress is produced in the nitride semiconductor that makes up the cavity end face, the generation of cracks in the nitride semiconductor can be prevented, and the end face protective film adheres well to the cavity end face and does not separate. This means that a nitride semiconductor laser element with high performance and output and an increased COD level can be obtained.

Example 2

A semiconductor laser element is formed by substantially the same method and constitution as in Example 1, except that, as shown in FIG. 2B, the protective film of the cavity end face in Example 1 is changed on the rear side to a first protective film 21a composed of AlN (32 nm) and a second protective film 22a composed of $SiO_2$ (250 nm), $SiO_2/ZrO_2$ films are formed in a thickness of 67 nm/44 nm with six cycle repetition thereon.

This semiconductor laser element has the same crystallinity of the first protective films as in Example 1, and the COD level is similarly increased.

Example 3

A semiconductor laser element was formed by substantially the same method and constitution as in Example 1, except that the protective film of the cavity end face in Example 1 was changed on the front side to a protective film composed of AlN (20 nm).

As shown in FIG. 6, a region in which the crystal axial orientation was different, within the first protective film 31, was identified in the lamination direction of the nitride semiconductor layer. The resulting electron beam diffraction images at the various points in FIG. 6 are substantially the same as those shown in FIG. 4.

Example 4

A semiconductor laser element was formed by substantially the same method and constitution as in Example 1, except that the protective film of the cavity end face in Example 1 was changed on the front side to a protective film composed of AlN (10 nm).

Figure 7:
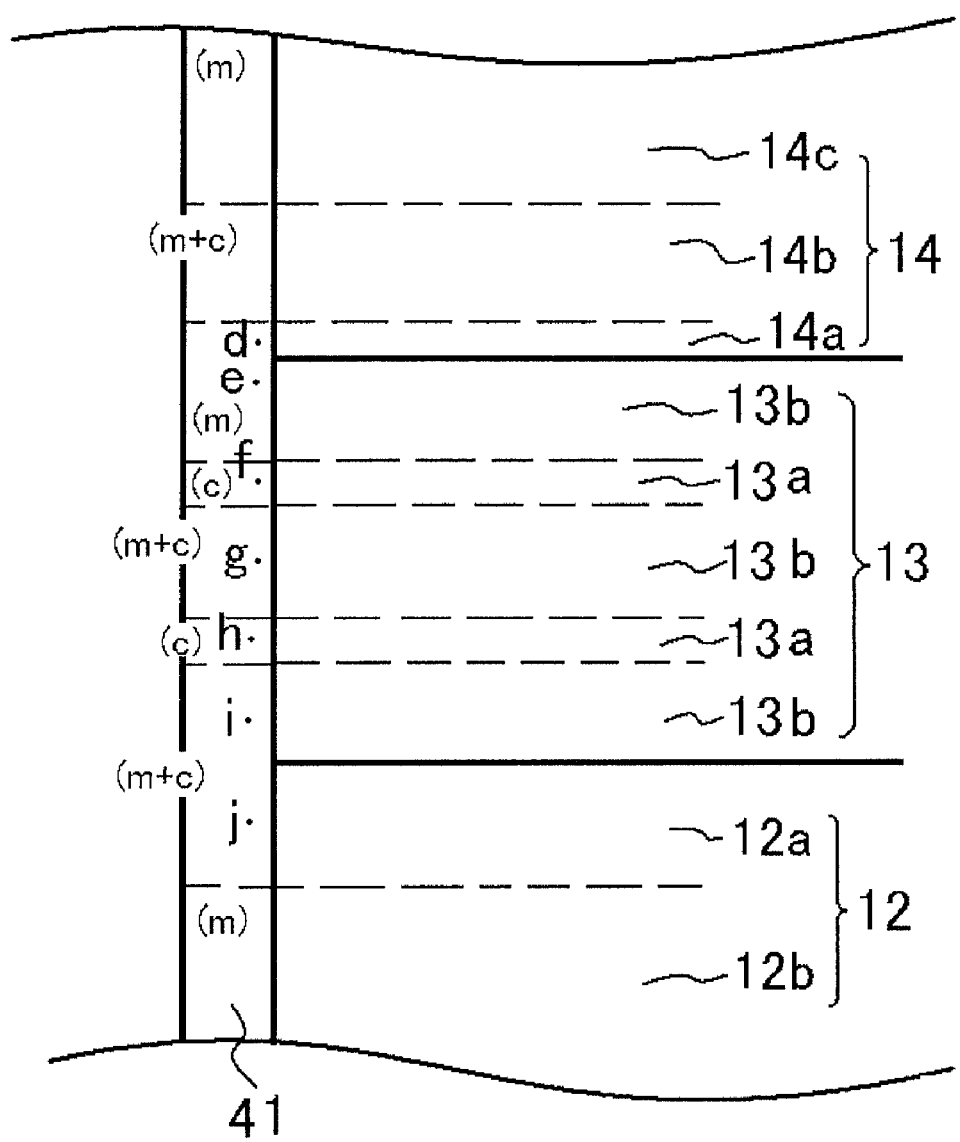
FIG. 7 is a schematic TEM image illustrating the state of axial orientation of still another cross sectional first protective film of the present invention.

As shown in FIG. 7, a region in which the crystal axial orientation was different, within the first protective film 41, was identified in the lamination direction of the nitride semiconductor layer. The resulting electron beam diffraction images at the various points in FIG. 7 are substantially the same as those shown in FIG. 4.

Example 5

In Example 5, a nitride semiconductor laser element is produced in substantially the same manner as in Example 1, except that when the first protective film 21 composed of AlN was formed on the cavity end face, the conditions were changed so that the Ar flow is 50 sccm, the $N_2$ flow is 10 sccm, the microwave power is 500 W, the RF power is 500 W, and the film formation rate is 3 nm/min.

The structure and characteristics of the first protective film of the nitride semiconductor laser element thus obtained are substantially the same as those in Example 1.

Example 6

In Example 6, a nitride semiconductor laser element is produced in substantially the same manner as in Example 1, except that when the first protective film 21 composed of AlN was formed on the cavity end face, the conditions were changed so that the Ar flow is 30 sccm, the $N_2$ flow is 6 sccm, the microwave power is 500 W, the RF power is 500 W, and the film formation rate is 3 nm/min.

The structure and characteristics of the first protective film of the nitride semiconductor laser element thus obtained are substantially the same as those in Example 1.

Example 7

In Example 7, a nitride semiconductor laser element is produced in substantially the same manner as in Example 1, except that when the first protective film 21 composed of AlN was formed on the cavity end face, the conditions were changed so that firstly the Ar flow is 30 sccm, the $N_2$ flow is 10 sccm, the microwave power is 800 W, the RF power is 800 W, and the film formation rate is 3 nm/min, and then, the Ar flow is 30 sccm, the $N_2$ flow is 10 sccm, the microwave power is 500 W, the RF power is 500 W, and the film formation rate is 2 nm/min.

The structure and characteristics of the first protective film of the nitride semiconductor laser element thus obtained are substantially the same as those in Example 1.

Example 8

In Example 8, a nitride semiconductor laser element is produced in substantially the same manner as in Example 1, except that when the first protective film 21 composed of AlN was formed on the cavity end face, the conditions were changed so that firstly the Ar flow is 50 sccm, the $N_2$ flow is 10 sccm, the microwave power is 500 W, the RF power is 500 W, and the film formation rate is 3 nm/min, and then, the Ar flow is 30 sccm, the $N_2$ flow is 10 sccm, the microwave power is 500 W, the RF power is 500 W, and the film formation rate is 2 nm/min.

The structure and characteristics of the first protective film of the nitride semiconductor laser element thus obtained are substantially the same as those in Example 1.

Example 9

In Example 9, a nitride semiconductor laser element is produced in substantially the same manner as in Example 1, except that when the first protective film 21 composed of AlN was formed on the cavity end face, the conditions were changed so that firstly the Ar flow is 30 sccm, the $N_2$ flow is 6 sccm, the microwave power is 500 W, the RF power is 500 W, and the film formation rate is 3 nm/min, and then, the Ar flow is 30 sccm, the $N_2$ flow is 10 sccm, the microwave power is 500 W, the RF power is 500 W, and the film formation rate is 2 nm/min.

The structure and characteristics of the first protective film of the nitride semiconductor laser element thus obtained are substantially the same as those in Example 1.

Example 10

In Example 10, a nitride semiconductor laser element is produced in substantially the same manner as in Example 1, except that when the first protective film 21 composed of AlN was formed on the cavity end face, the conditions were changed so that firstly the Ar flow is 30 sccm, the $N_2$ flow is 10 sccm, the microwave power is 500 W, the RF power is 500 W, and the film formation rate is 2 nm/min, and then, the wafer keep a distance of 20 mm from the target, the Ar flow is 30 sccm, the $N_2$ flow is 10 sccm, the microwave power is 500 W, the RF power is 500 W, and the film formation rate is 1.7 nm/min.

The structure and characteristics of the first protective film of the nitride semiconductor laser element thus obtained are substantially the same as those in Example 1.

Example 11

In Example 11, a semiconductor laser element was formed by substantially the same method and constitution as in Example 1, except that the first protective film 21 of the cavity end face in Example 1 was changed to a thickness of 10 nm.

The axial orientation of the first protective film of the resulting nitride semiconductor laser element changed hardly at all in the thickness direction of the protective film, regardless of which nitride semiconductor layer it was over, and the same changes as in Example 1 were noted, only in the in-plane direction of the first protective film.

Example 12

A semiconductor laser element is formed by substantially the same method and constitution as in Example 1, except the followings; the protective film of the cavity end face on the front side in Example 1 is changed to a first protective film 21 composed of AlN (30 nm), the first protective film is formed under the conditions that the Ar flow is 50 sccm, the $N_2$ flow is 5 sccm, the microwave power is 800 W, the RF power is 800 W, and the film formation rate is 7 nm/min.

The nitride semiconductor laser element obtained in Example 12 was observed with a field emission type of transmission electron microscope in the same manner as in Example 1. FIG. 8 is a schematic view of this.

It can be seen in FIG. 8 that the axial orientation in the in-plane is different with respect to the cavity end face depending on the composition of the nitride semiconductor layer, and that the first protective film whose crystal orientation is different from that of the cavity plane of the nitride semiconductor layer can be formed over the majority of the nitride semiconductor layer including the InGaN layer.

Also, it was found that as the thickness of the first protective film (AlN) increases, there is a change to C axial orientation in the region where M axial orientation and C axial orientation are both present. This change to C axial orientation was seen to appear at about 5 to 20 nm depending on the composition of the nitride semiconductor layer.

The nitride laser element thus obtained was measured for optical output in the same manner as in Example 1, whereupon substantially the same results were obtained as in Example 1.

Thus, with the nitride semiconductor laser element of this Example 12, it is possible to obtain the end face protective film with which there is no stress produced in the nitride semiconductor that makes up the cavity end face, cracking in the nitride semiconductor is prevented, adhesion with the cavity end face is good, and separation is prevented. It was confirmed that this allows a nitride semiconductor laser element to be obtained with an increased COD level, higher performance, and higher output.

Example 13

A semiconductor laser element is formed by substantially the same method and constitution as in Example 1, except the followings; the active layer is formed of a multi quantum well structure (MQW)) with a total thickness of 72 nm through that a barrier layer 13b composed of $In_{0.02}Ga_{0.98}N$ doped with Si (14 nm thick), a well layer 13a composed of undoped $In_{0.07}Ga_{0.93}N$ (8 nm thick) are laminated on the barrier layer 13b and this process is repeated 2 times, finally the barrier layer 13b composed of undoped $In_{0.02}Ga_{0.98}N$ (28 nm thick) is formed on the layers, and the protective film of the cavity end face on the front side in Example 1 is changed to a first protective film 21 composed of AlN (30 nm), the first protective film is formed under the conditions that the Ar flow is 50 sccm, the $N_2$ flow is 5 sccm, the microwave power is 800 W, the RF power is 800 W, and the film formation rate is 7 nm/min.

The structure and characteristics of the first protective film of the nitride semiconductor laser element thus obtained are substantially the same as those in Example 1.

Example 14

A semiconductor laser element of this Example 14 can be manufactured by the following method according to the method of Example 1.

First, an n-layer composed of $Al_{0.02}Ga_{0.98}N$ doped with Si at $4 \times 10^{18}/cm^3$ (1 μm thick) is grown on the GaN substrate at a growth temperature of 1100° C. using TMA, TMG and ammonia as the raw material gas with a silane gas for an impurity gas. Nest, $In_{0.05}Ga_{0.95}N$ doped with Si (0.15 μm thick) is grown at a growth temperature of 930° C., and an n-side clad layer composed of $Al_{0.06}Ga_{0.94}N$ doped with Si at $4\times10^{18}/cm^3$ (2 μm thick) is grown. This n-side clad layer may be composed of a super lattice structure.

Next, an n-side wave guide layer composed of undoped GaN (0.3 μm thick) is grown at a growth temperature of 1000° C. This wave guide layer 12a may be doped partially or wholly with n-type impurities.

The temperature is set to 900° C., a first barrier layer composed of $In_{0.02}Ga_{0.98}N$ doped with Si (70 nm thick), an undoped GaN (1 nm thick) on the first barrier layer, and at the temperature to 850° C., a well layer composed of undoped $In_{0.13}Ga_{0.87}N$ (3 nm thick) are laminated. The temperature is set to 900° C., undoped GaN (14 nm thick), and at the temperature to 850° C., a well layer composed of undoped $In_{0.13}Ga_{0.87}GaN$ (3 nm thick) are laminated. Finally the barrier layer composed of undoped $In_{0.02}Ga_{0.98}N$ (70 nm thick) is laminated.

A p-side cap layer is formed the same method as in Example 1.

Next, $Cp_2Mg$ gas and TMA are stopped, and p-side wave guide layer composed of undoped GaN (0.3 μm thick) is grown at a growth temperature of 1000° C. This p-side wave guide layer may be doped partially or wholly with p-type impurities.

A p-side clad layer and a p-side contact layer (15 nm thick) are formed the same method as in Example 1.

The resulting wafer on which the nitride semiconductor has been grown is taken out of the reaction vessel, a stripe-shaped structure of the nitride semiconductor which will be main body of the cavity in the laser element is formed the same method as in Example 1.

Next, a stripe-shaped mask composed of $SiO_2$ is formed on the surface of the p-side contact layer, and the nitride semiconductor layer(s) are etched by RIE method using $SiCl_4$ gas and the stripe-shaped mask. By this means, a stripe-shaped ridge waveguide region is formed with a width of 2.0 μm.

Then, the sides of the ridge are protected by an embedded film 15 composed of $ZrO_2$ (200 nm thick).

Next, a p-side electrode 17 and a third protective film is formed the same method as in Example 1. After that, ohmic annealing is performed.

A p-side pad electrode is formed and the surface of the substrate is polished the same method as in Example 1.

On the light exit side of the cavity end faces, a first protective film 21 is formed, and then a second protective film 22 is formed on the first protective film.

That is, the first protective film 21 (10 nm) which is composed of AlN is formed at a microwave power of 800 W, RF power of 800 W, and at a film formation rate of 3 nm/min, an Ar flow of 30 sccm, and a $N_2$ flow of 10 sccm with an ECR plasma sputtering apparatus.

Next, on the first protective film formed on the light exit face of the cavity, a $SiO_2$ film is formed as the second protective film 22 in a thickness of 295 nm with a sputtering apparatus using an Si target, at a microwave power of 500 W, RF power of 500 W, and an oxygen flow of 5 sccm.

On the light reflecting side of the cavity, an $ZrO_2$ film is formed in a thickness of 49 nm, and $SiO_2/ZrO_2$ films are formed in a thickness of 75 nm/49 nm with six cycle repetition thereon.

After that, the bar is chipped in the direction perpendicular to the end faces of the cavity to be formed into a chip for a semiconductor laser element.

The structure and characteristics of the first protective film of the nitride semiconductor laser element thus obtained are substantially the same as those in Example 1.

Example 15

A semiconductor laser element of this Example is formed by substantially the same method and constitution as in Example 1, except that, end face protective film in Example 1 is changed to a film composed of AlN (32 nm), $SiO_2$ (260 nm) and $ZrO_2$ (45 nm) in this order from the end face side of the cavity.

The structure and characteristics of the first protective film of the nitride semiconductor laser element thus obtained are substantially the same as those in Example 1.

The present invention can be applied to a wide range of nitride semiconductor elements with which the protective film needs to adhere well to the semiconductor layer, such as in use as light emitting elements (e.g., LD, LED, super luminescence diode, etc.), solar cells, light-receptive elements (e.g., light sensor, etc.), electric devices (e.g., transistor, power device, etc.) and the like. In particular, it is useful as nitride semiconductor elements in optical disk applications, optical communications systems, printers, optical exposure applications, and various devices for measurement, excitation light source for bio-specific applications and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor laser element comprising:
   nitride semiconductor layers in which a nitride semiconductor layer of a first conduction type, an active layer, and a nitride semiconductor layer of a second conduction type that is different from the first conduction type are laminated in that order;
   a cavity end face formed by the nitride semiconductor layers; and
   a protective film formed on the cavity end face,
   the nitride semiconductor layer of the first conduction type and the nitride semiconductor layer of the second conduction type having a layer containing Al, and the active layer having a layer containing In,
   the protective film having a region in which an axial orientation of crystals is the same as that of the cavity end face on the nitride semiconductor layer of the first conduction type and the nitride semiconductor layer of the second conduction type, and having another region in which an axial orientation of crystals is different from that of the cavity end face on the active layer.

2. The element according to claim 1, wherein the protective film has a region in which an axial orientation of crystals is different from that of a contact interface of the nitride semiconductor layers at the cavity end face with respect to the direction of lamination of the protective film.

3. The element according to claim 1, wherein the protective film has a region in which an axial orientation of crystals varies in the direction of lamination of the protective film.

4. The element according to claim 1, wherein the protective film has a hexagonal system crystal structure.

5. The element according to claim 1, wherein the protective film has a region lattice-matched to the nitride semiconductor layer.

6. The element according to claim 1, wherein
the active layer is a multiple quantum well structure comprising two or more well layers, and
the protective film is arranged such that the same axial orientation of the crystals is continuous in the lamination direction of the nitride semiconductor layer over the active layer between the two well layers.

7. The element according to claim 1, further comprising an additional protective film formed on the protective film, the additional protective film being an amorphous film.

8. The element according to claim 1, wherein
the active layer is composed of InGaN, and the indium proportion is in a range of 0.01 to 0.30.

9. The element according to claim 1, wherein
at least one of the nitride semiconductor layer of the first conduction type and the nitride semiconductor layer of the second conduction type is composed of AlGaN.

10. The element according to claim 1, wherein
the protective film is composed of AlN.

11. A nitride semiconductor laser element comprising:
nitride semiconductor layers in which a nitride semiconductor layer of a first conduction type, an active layer, and a nitride semiconductor layer of a second conduction type that is different from the first conduction type are laminated in that order;
a cavity end face formed by the nitride semiconductor layers; and
a protective film formed on the cavity end face,
the nitride semiconductor layer of the first conduction type and the nitride semiconductor layer of the second conduction type having a layer containing Al, and the active layer having a layer containing In,
the protective film having a first region and a second region aligned with the first region along the direction of lamination of the protective film, the second region having an axial orientation of crystals that is different from an axial orientation of crystals of the first region.

12. The element according to claim 11, wherein
the protective film has a region in which an axial orientation of crystals varies in the direction of lamination of the nitride semiconductor layers.

13. The element according to claim 11, wherein
the first region of the protective film contacts the cavity end face of the nitride semiconductor layer, the axial orientation of the crystals in the first region of the protective film being the same as an axial orientation of crystals of the cavity end face of the nitride semiconductor layer with respect to the direction of lamination of the protective film.

14. The element according to claim 11, wherein
the protective film has a hexagonal system crystal structure.

15. The element according to claim 11, wherein
the protective film has a region lattice-matched to the nitride semiconductor layer.

16. The element according to claim 11, wherein
the active layer is a multiple quantum well structure comprising two or more well layers, and
the protective film is arranged such that the same axial orientation of the crystals is continuous in the lamination direction of the nitride semiconductor layer over the active layer between the two well layers.

17. The element according to claim 11, further comprising an additional protective film formed on the protective film, the additional protective film being an amorphous film.

18. The element according to claim 11, wherein
the active layer is composed of InGaN, and the indium proportion is in a range of 0.01 to 0.30.

19. The element according to claim 11, wherein
at least one of the nitride semiconductor layer of the first conduction type and the nitride semiconductor layer of the second conduction type is composed of AlGaN.

20. The element according to claim 11, wherein
the protective film is composed of AlN.

* * * * *